US009726741B1

(12) United States Patent
Damadian

(10) Patent No.: US 9,726,741 B1
(45) Date of Patent: Aug. 8, 2017

(54) MAGNETIC RESONANCE IMAGING

(71) Applicant: Fonar Corporation, Melville, NY (US)

(72) Inventor: Raymond V. Damadian, Woodbury, NY (US)

(73) Assignee: Fonar Corporation, Melville, NY (US)

( * ) Notice: Subject to any disclaimer, the term of this patent is extended or adjusted under 35 U.S.C. 154(b) by 617 days.

(21) Appl. No.: 14/203,427

(22) Filed: Mar. 10, 2014

Related U.S. Application Data

(60) Provisional application No. 61/775,613, filed on Mar. 10, 2013, provisional application No. 61/775,614, filed on Mar. 10, 2013, provisional application No. 61/775,610, filed on Mar. 10, 2013.

(51) Int. Cl.
*G01V 3/00* (2006.01)
*G01R 33/56* (2006.01)

(52) U.S. Cl.
CPC ................ *G01R 33/5608* (2013.01)

(58) Field of Classification Search
USPC ......................................... 324/309
See application file for complete search history.

(56) References Cited

U.S. PATENT DOCUMENTS

| 4,689,556 | A | 8/1987 | Cedrone |
| 4,737,713 | A | 4/1988 | Danby et al. |
| RE32,689 | E | 6/1988 | Damadian |
| 5,266,913 | A | 11/1993 | Chapman |
| 6,414,490 | B1 | 7/2002 | Damadian et al. |
| 6,677,753 | B1 | 1/2004 | Danby et al. |
| 7,439,738 | B2 | 10/2008 | Pines et al. |
| 8,036,730 | B1* | 10/2011 | Damadian ............ A61B 5/0555 |
| | | | 324/307 |
| 8,055,326 | B1 | 11/2011 | Dworkin et al. |
| 2006/0255801 | A1* | 11/2006 | Ikeda ..................... G01R 33/54 |
| | | | 324/307 |
| 2007/0035301 | A1* | 2/2007 | Nakabayashi ......... G01R 33/28 |
| | | | 324/318 |
| 2007/0096739 | A1* | 5/2007 | Nakabayashi ..... G01R 33/3415 |
| | | | 324/318 |
| 2008/0027666 | A1* | 1/2008 | Schenkel ........... G01R 33/3875 |
| | | | 702/85 |
| 2009/0015256 | A1 | 1/2009 | Bottomley et al. |

(Continued)

OTHER PUBLICATIONS

Stark and Bradley, "Magnetic Resonance Imaging", vol. I, pp. 15-32, 1999.

*Primary Examiner* — Rodney Fuller
(74) *Attorney, Agent, or Firm* — Lerner, David, Littenberg, Krumholz & Mentlik, LLP

(57) ABSTRACT

An apparatus and concomitant method for imaging a subject using MR imaging includes exciting nuclei of the subject within an imaging plane using one or more transmitter circuits tuned to a first transmission frequency, sampling MR signals generated from the nuclei at the same time using one or more receiver circuits each receiver circuit having a bandwidth less than 500 kHz, and generating a MR image based on the sampled MR signals. The speed of MR imaging may be increased by providing multiple pairs of transmitter and receiver circuits to operate simultaneously on an imaging plane and/or by streamlining downstream signal processing using multiple phase detectors tuned to detect frequencies associated with particular phase shifts.

19 Claims, 11 Drawing Sheets

(56) References Cited

U.S. PATENT DOCUMENTS

| | | | |
|---|---|---|---|
| 2009/0093704 A1* | 4/2009 | Ma | A61B 5/417 600/410 |
| 2011/0044546 A1* | 2/2011 | Pan | G06T 11/006 382/195 |
| 2011/0087090 A1 | 4/2011 | Boernert et al. | |

* cited by examiner

FIGURE 3     300

PRIOR ART

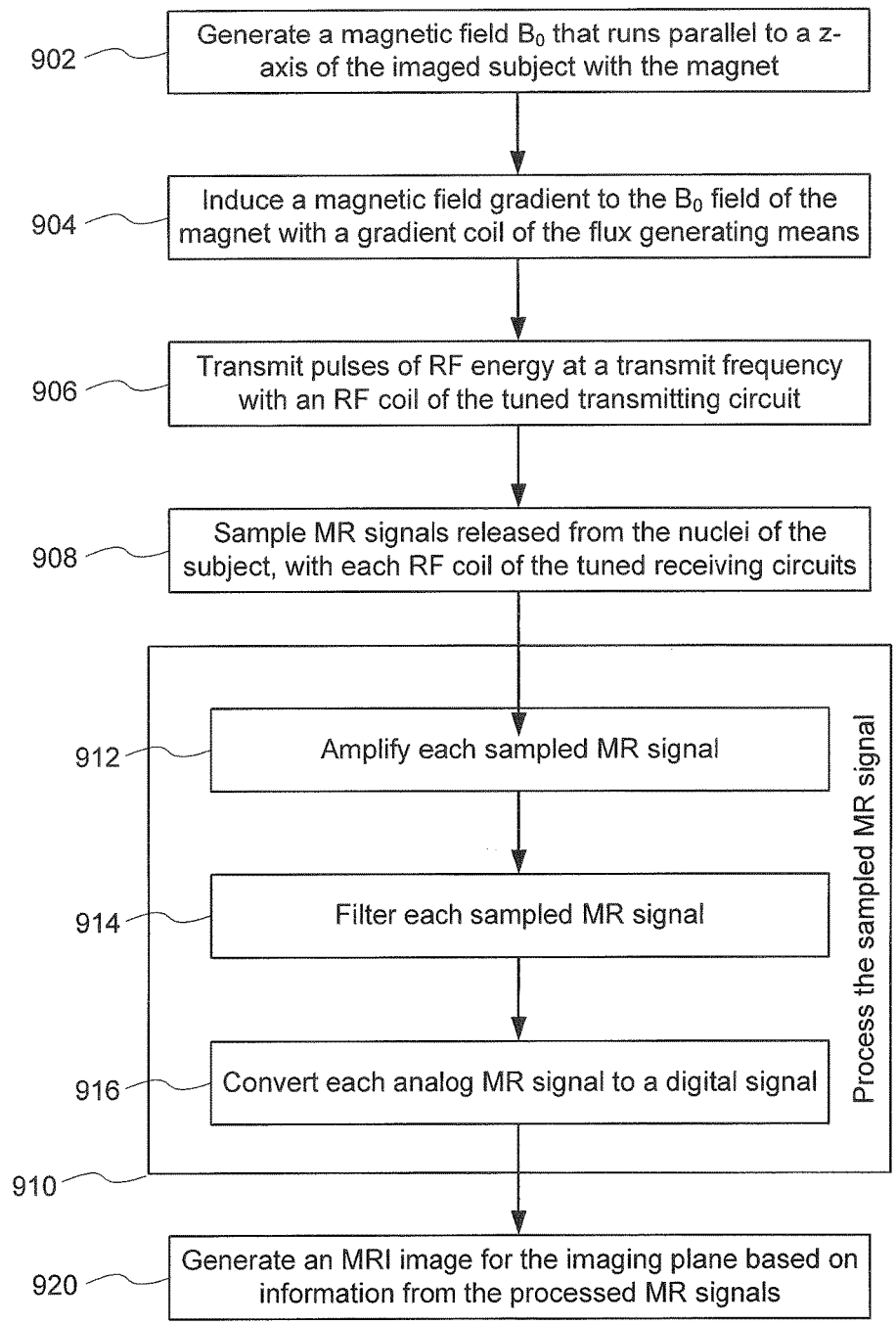
FIGURE 9      900

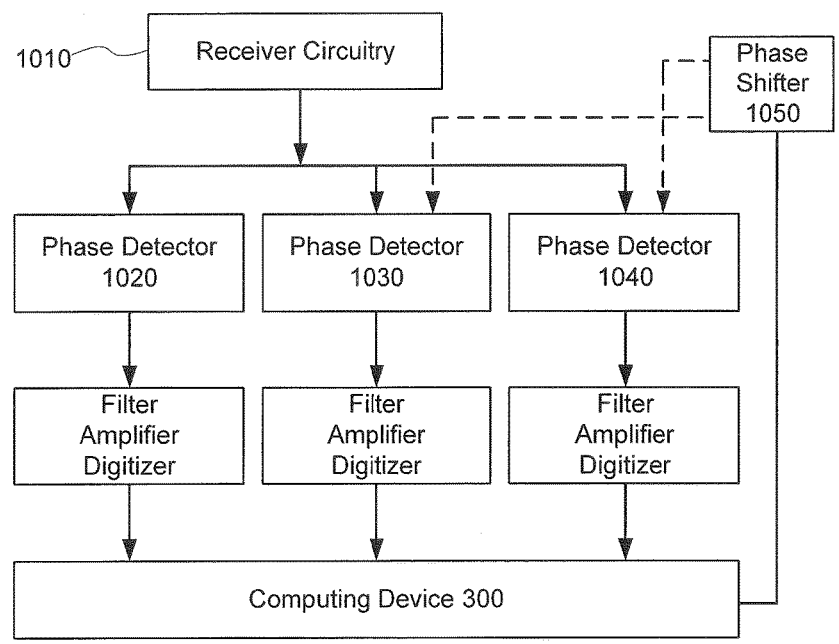
FIGURE 10       1000

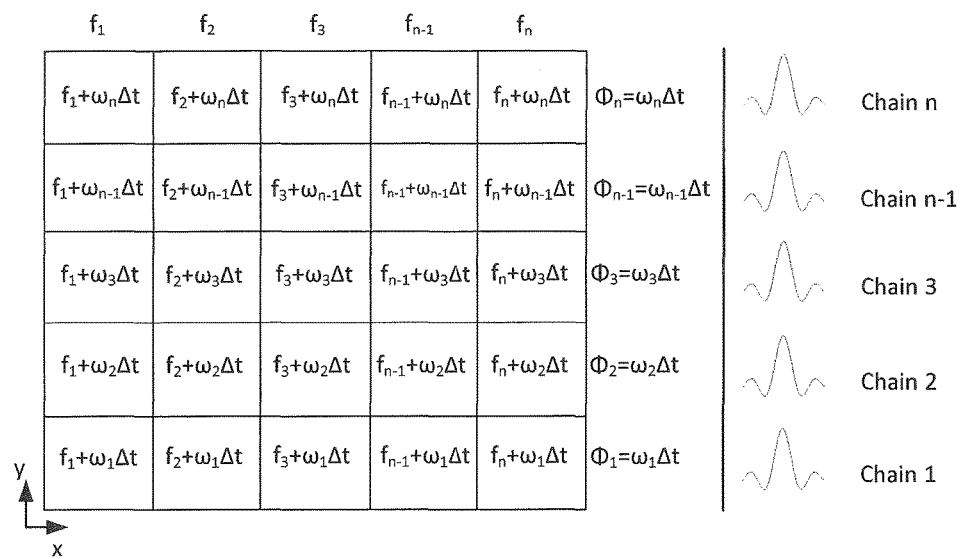
FIGURE 11      1100

MAGNETIC RESONANCE IMAGING

CROSS-REFERENCE TO RELATED APPLICATIONS

The present application claims the benefit of the filing date of U.S. Provisional Patent Application Nos. 61/775,613, 61/775,614, and 61/775,610 all filed Mar. 10, 2013, the disclosures of which are hereby incorporated herein by reference in their entirety.

FIELD OF THE INVENTION

The present invention relates to a magnetic resonance imaging (MRI) system and method of operating such a system.

BACKGROUND

In magnetic resonance imaging, an object to be imaged as, for example, a body of a human subject, is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the nuclei to precess in phase and in an excited state. As the precessing atomic nuclei relax, weak radio frequency signals are generated and emitted; such radio frequency signals are referred to herein as magnetic resonance signals.

Different tissues produce different signal characteristics. Tissue relaxation times are the dominant factor in determining signal characteristics. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of the patient's body differ in phase, amplitude and/or frequency. If the process is repeated numerous times using different combinations of gradients, the signals from the various repetitions together provide enough information to form a map of signal characteristics versus location within the body. Such a map can be reconstructed by conventional techniques well known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Many MRI systems use one or more solenoidal superconducting coils to provide the static magnetic field arranged so that the patient is disposed within a small tube running through the center of the coils. The coil and tube typically extend along a horizontal axis, so that the long axis or head-to-toe axis of the patient's body is in a horizontal position during the procedure.

Other MRI systems use iron core magnets to provide a more open environment for the patient. These magnets typically have a ferromagnetic frame with a pair of ferromagnetic poles disposed one over the other along a vertical pole axis with a gap between them for receiving the patient. The frame includes ferromagnetic flux return members such as plates or columns which are located outside the patient receiving area and extend vertically. A magnetic field is provided by permanent magnets or electromagnetic coils (superconductive or resistive) associated with the frame. A magnet of this type can be designed to provide a more open environment for the patient.

Ferromagnetic frame magnets having horizontal pole axes have also been developed. As disclosed, for example, in commonly assigned U.S. Pat. No. 6,414,490, issued on Jul. 2, 2002, and U.S. Pat. No. 6,677,753, issued on Jan. 13, 2004, the disclosures of which are incorporated by reference herein in their entirety, a magnet having poles spaced apart from one another along a horizontal axis provides a horizontally oriented magnetic field within a patient receiving gap between the poles. Such a magnet can be used with a patient positioning device including elevation and rotation mechanisms to provide extraordinary versatility in patient positioning. For example, where the patient positioning device includes a bed or similar device for supporting the patient recumbent position, the bed can be tilted and/or elevated so as to image the patient in essentially any position between a fully standing position and a fully recumbent position, and can be elevated so that essentially any portion of the patient's anatomy is disposed within the gap in an optimum position for imaging.

In each of the above described systems, the quality of an image generated from the (magnetic resonance) MR signals generated by the precessing nuclei will depend on the signal-to-noise ratio (SNR) between the MR signal and other noise emitted from or around the MR imaging system. As such, it is important to increase the SNR of the generated MR signals in order to achieve high quality MR imaging.

BRIEF SUMMARY OF THE INVENTION

One aspect of the present disclosure is directed to a method of imaging a subject using magnetic resonance imaging. The method involves directing a magnetic field at the subject, and applying a gradient along an axis of the magnetic field such that the magnetic field varies in strength along the axis. The method further involves exciting nuclei of the subject within an imaging plane within the magnetic field using one or more transmitter circuits tuned to one or more transmission frequencies and one or more transmission bandwidths, and sampling magnetic resonance signals generated from the nuclei at the same time using one or more receiver circuits each receiver circuit having a bandwidth less than 500 kHz. The bandwidths of the one or more transmitter circuits and one or more receiver circuits may be the same.

Further the method involves processing the sampled magnetic resonance signals, and generating a magnetic resonance image based on the processed magnetic resonance signals. In some examples, the method may further involve tuning at least one transmitter circuit to a second transmission frequency so as to sample magnetic resonance signals emitted from the nuclei of a second imaging plane of the subject, and generating a magnetic resonance image of the second imaging plane using the aforementioned exciting, sampling and processing steps at the second transmission frequency.

With regard to the one or more receiver circuits, each receiver circuit may sample the received signals at a bandwidth of about 100 Hz or less, about 10 Hz or less, or about 1 Hz. Similarly, with regard to the one or more transmitter circuits, each transmitter circuit may excite the nuclei of the subject at a bandwidth of about 100 Hz or less, about 10 Hz or less, or about 1 Hz. In some examples, the bandwidths may be between 1 Hz and 100 Hz. In other examples, the bandwidths may be between 10 Hz and 100 Hz. Also, in some examples, the one or more receiver circuits may include a plurality of receiver circuits each tuned to a different frequency. The plurality of receiver circuits may sample magnetic resonance signals emitted from nuclei at different locations within the imaging plane at the same time.

With respect to the processing of the MR signals, processing may include amplifying the sampled magnetic resonance signals, filtering the sampled magnetic resonance signals, and converting the sampled magnetic resonance signals from an analog format to a digital format.

Another aspect of the present disclosure is directed to an apparatus for imaging a subject using magnetic resonance imaging. The apparatus may include a magnet configured to generate a magnetic field at the subject, as well as one or more pairs of gradient coils configured to apply a magnetic field gradient along an axis of the magnetic field such that the magnetic field varies in strength along the axis. The apparatus may also include one or more tuned transmitter circuits configured to excite nuclei of the subject using a transmitting bandwidth of frequencies, in addition to one or more tuned receiver circuits configured to sample magnetic resonance signals emitted from the nuclei of the subject at a receiving bandwidth. Each receiver circuit may have a receiving bandwidth that is less than 500 kHz. The apparatus may yet further include additional circuitry for processing the sampled magnetic resonance signals and generating a magnetic resonance image.

The one or more tuned transmitter circuits may include at least three transmitter circuits each having a transmitting bandwidth of about 100 Hz or less, at least 26 transmitter circuits each having a transmitting bandwidth of about 10 Hz or less, or at least 256 transmitter circuits each having a transmitting bandwidth of about 1 Hz or less. Similarly, the one or more tuned receiver circuits may include at least three receiver circuits each having a receiving bandwidth of about 100 Hz or less, at least 26 receiver circuits each having a receiving bandwidth of about 10 Hz or less, or at least 256 receiver circuits each having a receiving bandwidth of about 1 Hz or less. In some examples, the one or more receiver circuits may include a plurality of receiver circuits each centered at a different frequency. In further examples, the one or more transmitter circuits may include a plurality of transmitter circuits each centered at a different frequency. In yet further examples, the one or more receiver circuits may include a plurality of receiver circuits configured to sample 256 magnetic resonance signals within 10 milliseconds, or even within 1 millisecond.

In some examples of the disclosure, the magnetic field gradient of the one or more pairs of gradient coils and the transmitting bandwidth of the one or more tuned transmitter circuits may be configured to excite a slice of the imaged subject between about 1 millimeters and about 10 millimeters thick, and in some cases between about 1 millimeters and about 7 millimeters thick.

Yet another aspect of the disclosure is directed to a magnetic resonance imaging system including any of the above described apparatuses as well as computing circuitry coupled to the apparatus. The computing circuitry may include a plurality of demodulation circuits. Each demodulation circuit may be coupled to a respective receiver circuit and configured to demodulate a received signal at the respective receiver circuit. The computing circuitry may be further configured to generate a magnetic resonance image based on the demodulated signals.

A further aspect of the disclosure is directed to a system for high-speed MR imaging, which comprises a transmitter subsystem having transmitter circuitry, a receiver subsystem having receiver circuitry, one or more computing devices, and a memory for storing a plurality of data, and instructions executable by the one or more computing devices. In one aspect, the instructions cause the transmitter subsystem to activate a first magnetic field gradient, apply the first magnetic field gradient along a first direction, such that the first magnetic field gradient divides the first direction into a plurality of frequency domains. The instructions further cause the transmitter subsystem to activate a second magnetic field gradient along a second direction perpendicular to the first direction. In another aspect, the instructions cause the receiver subsystem to receive a plurality of signals for each of the frequency domains at a set of phase detectors, each phase detector tuned to detect and pass frequencies associated with a particular phase shift, and perform analysis on the signals to generate an MR image.

An additional aspect of the disclosure is directed to a system for high-speed MR imaging, which comprises a transmitter subsystem having transmitter circuitry, a receiver subsystem having receiver circuitry, one or more computing devices, and a memory for storing a plurality of data, and instructions executable by the one or more computing devices. In one aspect, the instructions cause the transmitter subsystem to activate a first magnetic field gradient, apply the first magnetic field gradient along a first direction, such that the first magnetic field gradient divides the first direction into a plurality of frequency domains. The instructions further cause the transmitter subsystem to activate a second magnetic field gradient along a second direction perpendicular to the first direction. In another aspect, the instructions cause the receiver subsystem to receive a plurality of signals for each of the frequency domains, filter the signals based upon a particular phase shift, and perform analysis on the signals to generate an MR image.

Yet another aspect of the disclosure is directed to a method of high-speed MR imaging. The method involves applying, using the computer-implemented transmitter, the first magnetic field gradient along a first direction, such that the first magnetic field gradient divides the first direction into a plurality of frequency domains. The method further involves activating, using the computer-implemented transmitter, a second magnetic field gradient, and applying, using the computer-implemented transmitter, the second magnetic field gradient along a second direction perpendicular to the first direction. Then, the method involves receiving, using a computer-implemented receiver, a plurality of signals for each of the frequency domains at a set of phase detectors, each phase detector tuned to receive and pass frequencies associated with a particular phase shift, and performing, using the computer-implemented receiver, analysis on the signals to generate an MR image.

BRIEF DESCRIPTION OF THE DRAWINGS

FIG. 9 is a flow diagram of an operation of the MRI magnet subsystem of FIG. 8.

FIG. 10 is a schematic diagram of a receiver subsystem depicting various components coupled to the receiver circuits of the MRI magnet subsystem of FIG. 8.

FIG. 11 is a diagram of a two-dimensional imaging plane sampled and processed by the receiver subsystem of FIG. 10.

DETAILED DESCRIPTION

Figure 1:
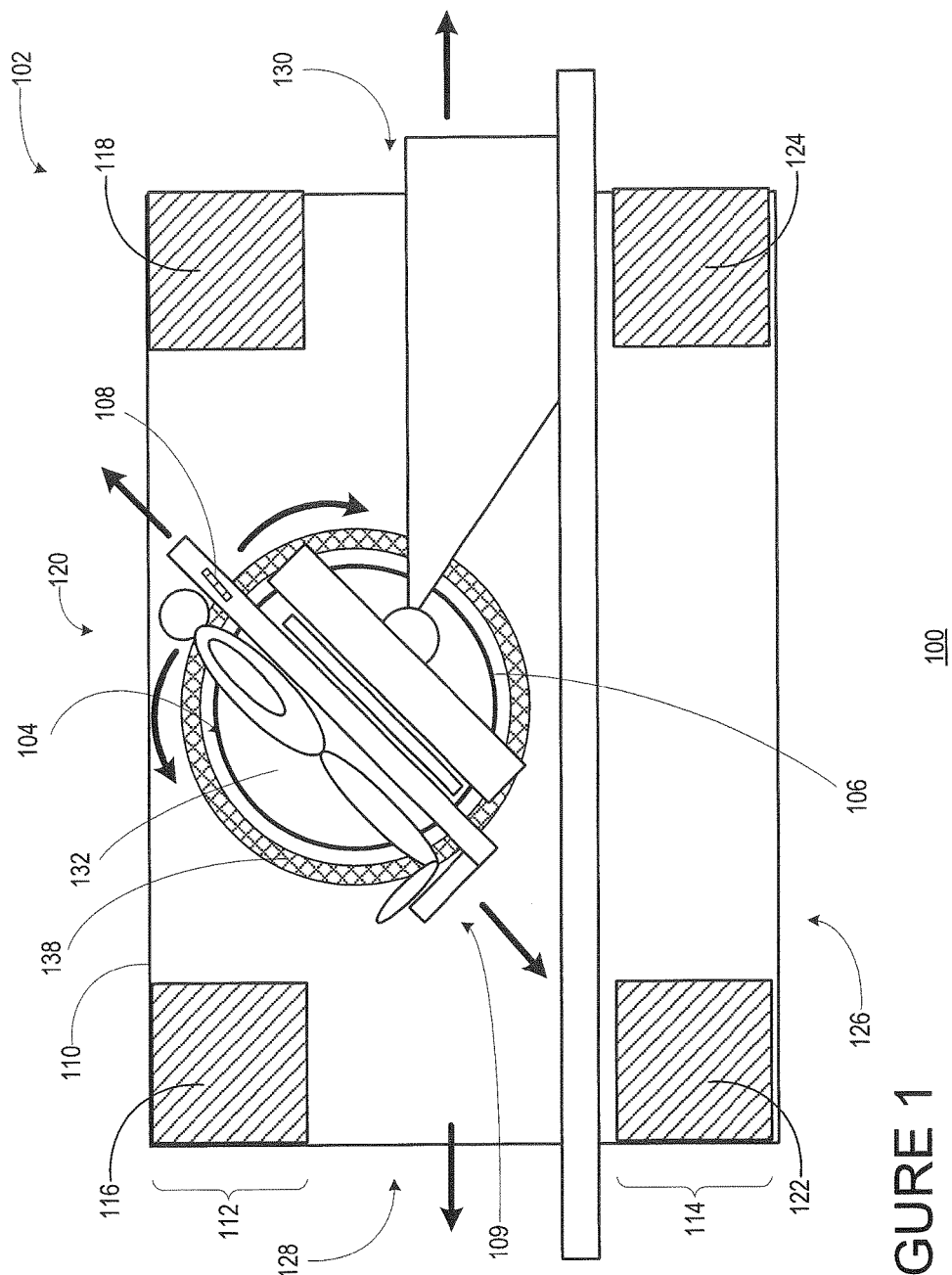
FIG. 1 is a sectional view of an MRI magnet subsystem according to an aspect of the disclosure.

FIG. 1 of the current application shows a sectional view of an example MRI magnet subsystem 100 according to a first embodiment of the disclosure. Although the present disclosure is largely described in the context of this and other MRI subsystems that have ferromagnetic frame magnets with horizontal pole axes, it will be understood that the present disclosure is equally applicable to other MRI subsystems having different magnet frames and different magnet configurations, including but not limited to solenoidal superconducting coils, iron core magnets, cylindrical bore type magnets, ferromagnetic frame magnets having a vertical pole axis, and other magnets that do not have iron in their frames.

The MRI magnet subsystem 100 includes a magnet having a ferromagnetic frame 102, a flux generating means 104, a tuned transmitter circuit 106 and a tuned receiver circuit 108, each of which is described in further detail below. The MRI subsystem further includes a patient handling system 109 used to support a patient in one or more positions (e.g., standing, sitting, recumbent, Trendelburg and reverse-Trendleburg orientations etc.).

The ferromagnetic frame 102 includes a first side wall 110 and a second side wall (not shown). The side walls extend vertically. For purposes of clarity, FIG. 1 does not show the second side wall or any of its associated structures. The ferromagnetic frame 102 also includes a top flux return structure 112 and a bottom flux return structure 114. The top flux return structure 112 may include two columnar structures 116 and 118. Between these two columnar structures, a top opening 120 is defined. Similarly, the bottom flux return structure 114 may include two columns 122 and 124 that together define a bottom opening 126. Thus, the side walls and the flux return members form a rectilinear structure, with the top flux return structure 112 constituting the top wall of the rectilinear structure, the bottom flux return structure 114 constituting the bottom wall of the rectilinear structure and the side walls forming the side walls of the rectilinear structure. The frame 102 defines a front patient opening 128 on one side of the frame 102 and a similar back patient opening 130 on the opposite side of the frame 102. The ferromagnetic frame 102 further includes a first magnetic pole 132 and a second magnetic pole (not shown, but horizontally displaced opposite the first magnetic 132). The first magnetic pole 132 extends from the first side wall 110 towards the second side wall and the second magnetic pole extends from the second side wall towards the first side wall 110. Magnetic poles are generally cylindrical and are coaxial with one another on a common horizontal polar axis. Between the magnetic poles is a gap accessed by the front patient opening 128, the back patient opening 130, the top opening 120 or the bottom opening 126.

The flux generating means 104 includes a first electromagnetic coil assembly 138 magnetically coupled to ferromagnetic frame 102, proximate to the first side wall 110, and parallel to the first side wall 110. The flux generating means 104 also includes a second electromagnet coil assembly (not shown, but comparable to the first electromagnetic coil assembly 138) magnetically coupled to ferromagnetic frame 102, proximate to the second side wall, and parallel to the second side wall. In other examples of the disclosure, the flux generating means 104 may include additional electromagnetic coil assemblies magnetically coupled to the ferromagnetic frame 102. These electromagnetic coil assemblies may be either resistive or superconductive. Alternatively, the flux generating means 104 may be a permanent magnet.

The tuned transmitter circuit 106 includes a radio-frequency (RF) transmit coil. The RF transmit coil is illustrated in FIG. 1 as being located some distance from the patient and the system may configured in that way. However, the RF transmit coil not need to be located only where shown in FIG. 1. In other examples, the RF transmit coil can be located at a pole surface. In one example of the disclosure, the RF transmit coil may be a planar structure that is positioned proximate the flux generation means 104. In another example, the RF transmit coil may be positioned proximate the anatomy of interest of the subject. For instance, if an MRI is being performed of a patient's head, the patient's head may be positioned in an RF coil structure. As a further example, if a portion of the spine is being imaged, the transmitter may be placed adjacent the patient's spine. Depending on the anatomy of interest, RF coils of the type described in commonly assigned U.S. Pat. No. 8,055, 326, disclosing various coil geometries, may be employed. The disclosure of the '326 patent is incorporated by reference herein in its entirety.

Additional electronic components, such as one or more capacitors that form a resonant circuit are used in conjunction with the RF transmitter unit. In some examples of the disclosure, the coupling between the RF transmit coil and the one or more capacitors may be adjusted. By adjusting the coupling between the RF transmit coil and the capacitors, the phase and/or frequency of the transmitter circuit may be dynamically tuned. In other examples, other phase/frequency tuning components and techniques known in the art may be employed.

The tuned receiver circuit 108 includes a radio-frequency (RF) receiver coil. The receiver coil is preferably positioned proximate the anatomy of interest. Positioning of the RF receiver coil proximate the anatomy of interest may be achieved in any of the manners described above in connection with the RF transmit coil. In the case of the RF receiver coil, given that the generated RF signals from the nuclei will likely be of low signal strength, the RF receiver coil is most preferably positioned very near the anatomy of interest. In addition, it is not uncommon that the RF transmitter and receiver coils will comprise the same unit that may switch between transmitting and receiving the RF signals (i.e., a transceiver). Receiver coil geometries such as those described in the '326 patent may be used. As with the transmitter circuit 106, the receiver circuit may also include additional electronic components known in the art for dynamically tuning phase and/or frequency, and for forming a resonant circuit. For example, the coupling between the RF receiver coil and the one or more capacitors may be adjusted.

Dynamic tuning of the single transmitter circuit 106 and single receiver circuit 108 may enable the transmitter/receiver pair to collect signals across a wide band of frequencies, even if each circuit itself is tuned to a relatively narrow bandwidth (e.g., 100 Hz, 10 Hz, 1 Hz). This may be accomplished by stepwise adjusting the frequency of the transmitter circuit so that the full band of desired signal frequencies is swept across. For instance, the transmitter circuit may have a bandwidth of about 100 Hz and may be tuned to a center frequency of 25.5 MHz. Yet the transmitter circuit may still be capable of transmitting RF energy at frequencies outside the 100 Hz bandwidth of the 25.5 MHz band by dynamically tuning the transmitter circuit to other center frequencies in 100 Hz steps (e.g., 25.5001 MHz, 25.5002 MHz, etc.) so as to excite several imaging planes of the patient (e.g., each plane at a different frequency of the slice-select gradient). In a similar fashion, the receiver circuit may have a bandwidth of about 100 Hz and may be tuned to a center frequency of 25.5 MHz. Yet the receiver circuit may still be capable of receiving MR signals at frequencies outside the 100 Hz bandwidth of the excited center frequencies by dynamically tuning the receiver circuit to other center frequencies in 100 Hz steps. For example, 25.001 MHz and 25.002 MHz so as to sample the entire frequency encoded gradient of the slice excited by the transmitter.

Figure 2:
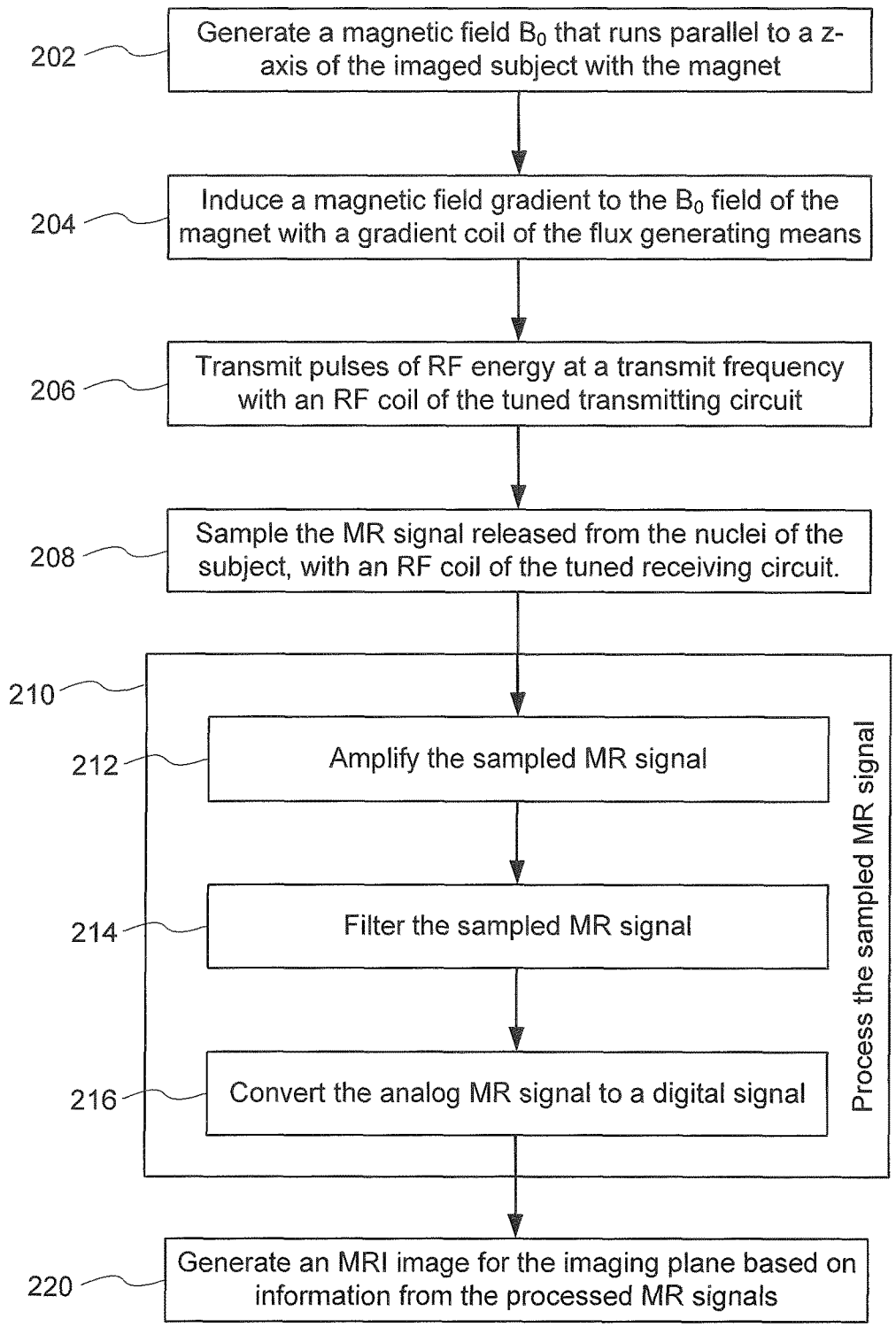
FIG. 2 is a flow diagram of operations of the MRI magnet subsystem of FIG. 1.

FIG. 2 is a flow chart that depicts an operation 200 of the subsystem 100 of FIG. 1. It should be understood that the following steps of the operation 200 do not have to be performed in the precise order described below. Rather, various steps can be handled in a different order, or simultaneously. Moreover, steps may be added or omitted.

In block 202 of the operation 200, the magnetic poles of the magnet generate a magnetic field $B_0$ that runs parallel to a z-axis of the imaged subject. In block 204, gradient coils of the flux generation means are engaged to induce a gradient in the $B_0$ field. With a gradient, the magnetic field strength of the $B_0$ field gradually varies along the length of the gradient axis. The gradient axis may be any axis of the $B_0$ field (e.g., x-axis, y-axis, z-axis), and may be selected based on the desired imaging plane of the subject (e.g., a coronal view, an axial view, a sagittal view). The generated gradient causes nuclei of the subject to be excitable at different resonant frequencies depending on their position along the gradient. For example, if a gradient is generated along the z-axis, all of the nuclei within a first slice transverse to the z-axis are excitable at a first resonance frequency (e.g., 25.5001 MHz), whereas the nuclei of a second slice axially displaced from the first slice are excitable at a second resonance frequency (e.g., 25.5002 MHz).

In block 206, the RF coil of the tuned transmitting circuit transmits one or more pulses of RF energy at a transmit frequency. The one or more pulses of RF energy may be transmitted in a direction perpendicular to the gradient axis discussed above. The RF pulse temporarily excites the nuclei of the subject at the particular slice of the subject whose magnetic field strength generates a nuclear resonance frequency that corresponds to the transmitter frequency. The particular thickness of the excited slice may depend on the magnitude or steepness of the $B_0$ field gradient and the bandwidth of the tuned transmitter circuit. For instance, a pulse having a narrower bandwidth will excite only the nuclei of the slice corresponding to the bandwidth of the transmit frequency. Accordingly, the thickness of the excited slice may be controlled by adjusting the bandwidth of the tuned transmitter circuit. Alternatively, the thickness of the excited slice may be controlled by adjusting the magnitude of the applied gradient.

As the nuclei of the subject transition from their excited state to a relaxed state, MR signals are generated from the excited nuclei. In block 208, the RF coil of the tuned receiving circuit samples the generated MR signals. Sampling the MR signals may be accomplished by applying a phase-encoding gradient and/or a frequency-encoding gradient to the excited nuclei. The gradients may be generated by the flux generating means, such as by using gradient coils perpendicular to those activated in step 204 to generate a slice-select gradient.

Conventionally, the MR signals are divided into voxels of the imaging plane (slice). Typically, an imaging plane is made up of 65,536 voxels in a 256 by 256 square grid. By generating each of the phase-encode and frequency-encode gradients, the nuclei may be effectively identified as belonging to a respective voxel based on its phase and frequency characteristics.

In block 210, the MRI system processes the sampled MR signals. Processing of the MR signals may involve digital demodulation of the signals, and may include such subtasks as amplification of the sampled signals (sub-block 212), filtering the signal (sub-block 214), and analog-to-digital conversion of the signal (sub-block 216). The relative position of each sampled MR signal (i.e., the spatial origin of the signal within the subject) may be ascertained based on a combination of phase-encoding and frequency-encoding information. Thus, MR signals for each portion of the imaged plane of the subject may be sampled and processed by the tuned receiving circuit and downstream processing circuitry or techniques. The MR signal processing may be performed by one or more computers electrically coupled to the tuned receiver circuit, such as the computer described below in connection with FIG. 3.

In block 220, once all the voxels are sampled and processed, an image for that plane may be generated at the computer based on information from the received and processed signals.

Figure 3:
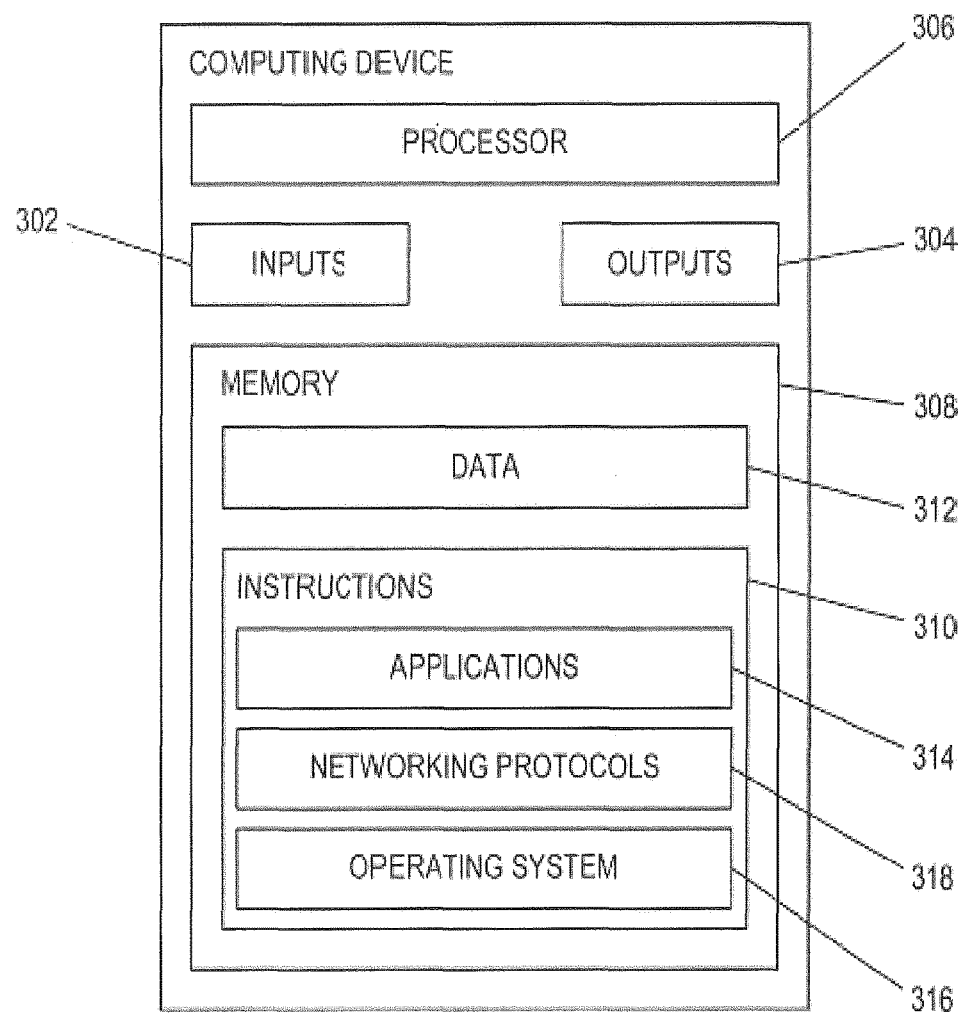
FIG. 3 is a computing device for processing RF signals and generating an MRI image of the MRI magnet subsystem of FIG. 1.

FIG. 3 shows one example of an apparatus 300 for implementing the computer that processes the RF signals and generates the MRI image. The example apparatus 300 is a computing device that may be used to further control the MRI subsystem 100.

The apparatus 300 may include, for example, one or more user inputs 302 such as a keyboard and mouse and/or other types of input devices such as pen-inputs, joysticks, buttons, touch screens, etc., and one or more outputs 304, such as a generated MRI image. As shown, apparatus 300 further contains a processor 306, and memory or computer readable medium 308.

Memory 308 stores information accessible by processor 306, including instructions 310 that may be executed by the processor 308 and data 312 that may be retrieved, manipulated or stored by the processor. The memory 308 may be of any type capable of storing information accessible by the processor, such as a hard-drive, ROM, RAM, CD-ROM, DVD, Blu-Ray disk, flash memories, write-capable or read-only memories. The processor 306 may comprise any number of well-known processors, such as processors from Intel Corporation and Advanced Micro Devices. Alternatively, the processor 306 may be a dedicated controller for executing operations, such as an ASIC or field programmable gate arrays (FPGAs).

The instructions 310 may comprise any set of instructions to be executed directly (such as machine code) or indirectly (such as scripts) by the processor. In that regard, the terms "instructions," "applications" and "programs" are used interchangeably herein. The instructions may be stored in any computer language or format, such as in executable/object code or modules of source code.

Data 312 may be retrieved, stored or modified by processor 306 in accordance with the instructions 310. The data may be stored as a collection of data. For instance, although the invention is not limited by any particular data structure, the data may be stored in computer registers, in a relational database as a table having a plurality of different fields and records, XML documents, or flat files.

The data may also be formatted in any computer readable format such as, but not limited to, binary values, ASCII etc. Similarly, the data may include images stored in a variety of formats. Moreover, the data may include any information sufficient to identify the relevant information, such as descriptive text, proprietary codes, pointers, references to data stored in other memories (including other locations in a network) or information which is used by a function to calculate the relevant data.

Although the processor 306 and memory 308 are functionally illustrated in FIG. 3 as being within the same block, it will be understood that the processor and memory may actually comprise multiple processors and memories that may or may not be stored within the same physical housing or location. For example, some or all of the instructions and data may be stored on a computer-readable removable recording medium such as a CD-ROM, DVD or Blu-Ray disk. Alternatively, such information may be stored within a read-only computer chip. Some or all of the instructions and data may be stored in a location physically remote from, yet still accessible by, the processor. Similarly, the processor may actually comprise a collection of processors which may or may not operate in parallel. Data may be distributed and stored across multiple memories 1008 such as hard drives, data centers, server farms or the like.

In addition, the memory 308 in apparatus 300 may include one or more applications or programs 314 adapted to provide any of the functions described with respect to the computer 300 and in accordance with the various aspects of the invention discussed above and below. Each device may include and execute specific instructions or applications, desirably under management of the processor 306 in conjunction with an operating system 316 and networking protocols instructions 318 to provide the functionality described above.

Figure 4:
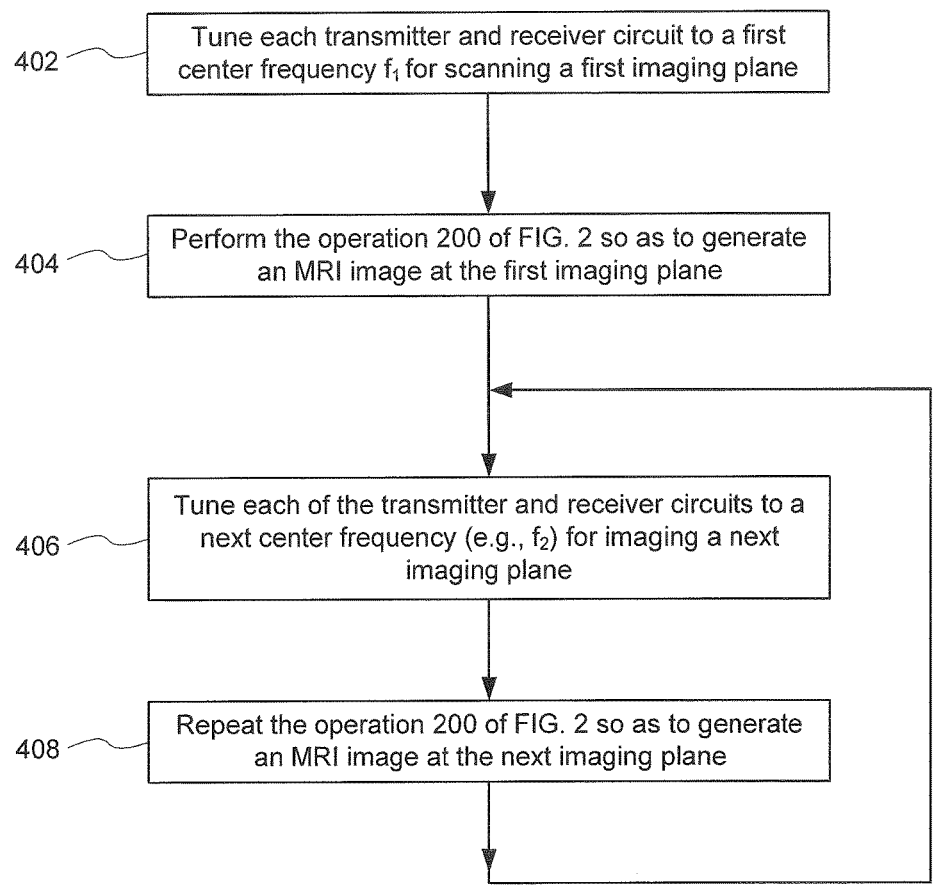
FIG. 4 is a flow diagram of operations of the MRI magnet subsystem of FIG. 1.

Returning to the operation 200 of FIG. 2, operation 200 may be repeated at various parallel and/or orthogonal slices of the subject. For instance, a typical scan of a subject's brain may be made up of fifteen or more separate coronal plane scans. FIG. 4 is a flow diagram depicting an operation 400 of a single transmitter/receiver pair having relatively narrow bandwidths (e.g., about 1 Hz, about 10 Hz, about 100 Hz) performing a scan having multiple imaging planes. In block 402, the transmitter circuit is tuned to a first center frequency $f_1$ for scanning a first slice or imaging plane of the subject. In block 404, the MRI system performs the operation 200 of FIG. 2 so as to generate an MR image at the slice of the subject corresponding to frequency $f_1$. Because of the narrow bandwidth of the energy pulse generated by the transmitter circuit, only the nuclei at a relatively thin slice corresponding to the first center frequency $f_1$ are excited during the operation. The tuned receiver circuit, also set to a narrow bandwidth, samples and processes the MR signals generated at the very thin slice of the subject excited by the transmitter circuit.

In block 406, the center frequency of the transmitter circuit is tuned to a next center frequency (e.g., $f_2$) still having a narrow bandwidth. In block 408, the excitation and sampling of operation 200 is repeated so as to generate an MR image at an imaging plane corresponding to the next center frequency $f_2$. The steps of blocks 406 and 408 may be repeated as many times as necessary (e.g., fifteen times) in order to complete the scan of the subject, with each iteration of the operation 200 being performed at a different center frequency so as to generate MR images of different imaging planes of the subject.

In some examples, reiteration of blocks 406 and 408 may involve application of different combinations of magnetic field gradients, so as to image a plane of the subject along a different axis. For example, whereas the first scan of the subject may be performed at a coronal plane, the second scan may be performed at a sagittal plane.

While the above example operations utilize a low-bandwidth transmitter circuit to achieve excitation of a relatively thin slice of nuclei (e.g., between about 1 mm and about 7 mm) within the subject, the low-bandwidth transmitter circuit is not necessary to achieve low-bandwidth sampling of the subject. For instance, in some examples of the disclosure, a high-bandwidth transmitter circuit may be used to excite a relatively thick slice of nuclei within the subject (e.g., between about 7 mm and about 10 mm). The center frequency of a low-bandwidth receiver circuit may then be adjusted or swept across the band of frequencies corresponding to the imaging planes excited by the generated energy pulses of the high-bandwidth transmitter circuit.

Further, it will be understood that the thickness of any given slice is a function of not only the bandwidth of the transmitter circuit but also the magnitude of the applied magnetic field gradient. As such, the bandwidth of the transmitter does not, by itself, dictate the thickness of the imaged slice. For purposes of the present disclosure, the transmitter may be set to any bandwidth so long as the bandwidth is not altered as to significantly affect the amount of time necessary to excite and then sample the nuclei of the subject, and so long as the imaged slice has a thickness of about 10 mm or less.

One advantage of narrow-bandwidth imaging according to the first embodiment is a significant increase in the signal-to-noise ratio (SNR) of the sampled MR signals. To illustrate this increase in SNR, consider an MRI apparatus having an RF transmitter/receiver coil pair that operates with a bandwidth of 500 kHz. The increase of SNR in the apparatus of the first embodiment would be equal to the square root of the reduction in bandwidth. For instance, an MRI subsystem having a coil pair with a bandwidth of 1 Hz would have an increase in SNR of sqrt(500,000/1) or about 700 times. For further example, a subsystem having a coil pair having a bandwidth of 10 Hz would have an increase in SNR of sqrt(500,000/10) or about 220 times. Even a subsystem operating at a bandwidth of 100 Hz would have a significant increase in SNR of sqrt(500,000/100) or about 70 times. This demonstrates the significant improvement in SNR yielded by low-bandwidth MR imaging.

One drawback of imaging a subject using the transmitter/receiver pair of the first embodiment is that the sampling process can be very time consuming. In the above example, if the receiver samples a single voxel imaging of a 256 by 256 voxel plane at a sampling time of 10 milliseconds, then it would take about 655 seconds (or approximately 11 minutes) to sample the entire plane. A full 15-plane scan would take about 9,830 seconds (or approximately 2 hours and 45 minutes). As such, while it is desirable to improve SNR of the generated MR image, it is also desirable to reduce the amount of time necessary to generate the image.

Figure 5:
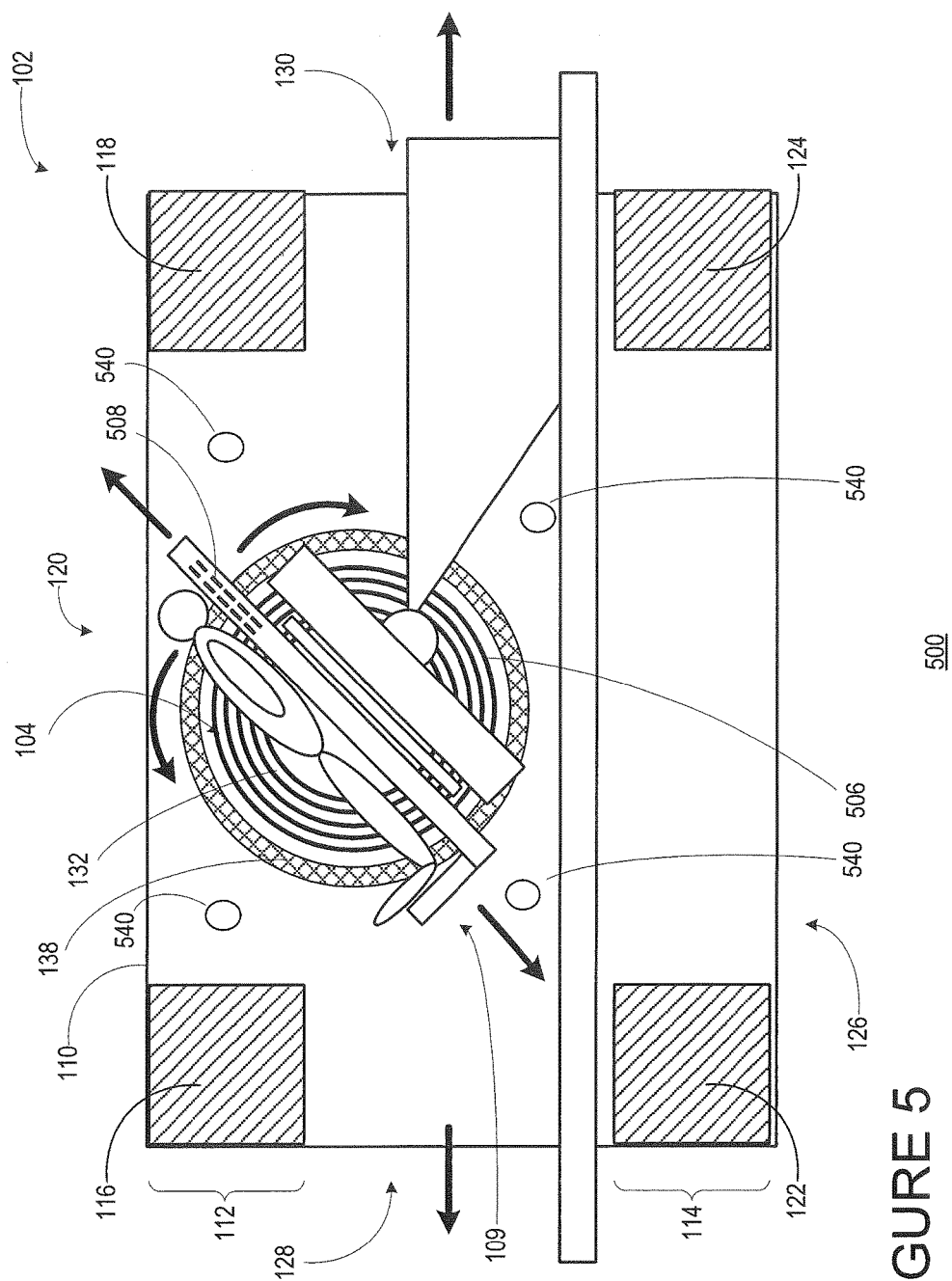
FIG. 5 is a sectional view of another MRI magnet subsystem according to another aspect of the disclosure.

One way to reduce the amount of time necessary to generate an MR image without affecting the SNR of the imaging process is to operate multiple pairs of transmitter and receiver circuits simultaneously. The transmitter/receiver circuit pairs could be configured to sample and process portions of separate imaging planes at the same time. FIG. 5 is a modified MRI subsystem 500 according to a second embodiment of the disclosure having simultaneously operative pairs of transmitter and receiver circuits. The modified MRI subsystem 500 includes all the same components as the MRI subsystem 100 of the first embodiment, as well as a few additional features. One such feature is that the modified MRI subsystem 500 includes multiple tuned transmitter circuits 506 and tuned receiver circuits 508. As with the transmitter and receiver circuits of FIG. 1, the multiple tuned transmitter circuits 506 and tuned receiver circuits 508 of FIG. 5 need not be positioned as shown in FIG. 5 and may be positioned in other parts of the subsystem 500 (e.g., at a pole surface, proximate the flux generation means, proximate the anatomy of interest, etc.). Each transmitter circuit may be set to a different center frequency. Likewise, each receiver circuit may be paired with a respective transmitter circuit and may be set to a different center frequency. In the example of FIG. 5, the transmitter/receiver pairs 506/508, may be set to respective center frequencies, each having a bandwidth of 10-100 Hz or less. In this sense, each transmitter/receiver circuit pair may also be tuned to image a different imaging plane along the magnetic field gradient.

Another feature of the modified MRI subsystem 400 is an RF nulling apparatus 540 having one or more pairs of nulling coils for generating a null line along a select line of the subject. Systems, devices, and techniques for RF nulling are further described in greater detail in provisional application Ser. No. 61/775,610 and concurrently filed non-provisional application entitled "System and Method For Magnetic Resonance Imaging Using Null Zones," both of which are commonly owned and the disclosures of which are hereby incorporated in their entirety herein.

Figure 6:
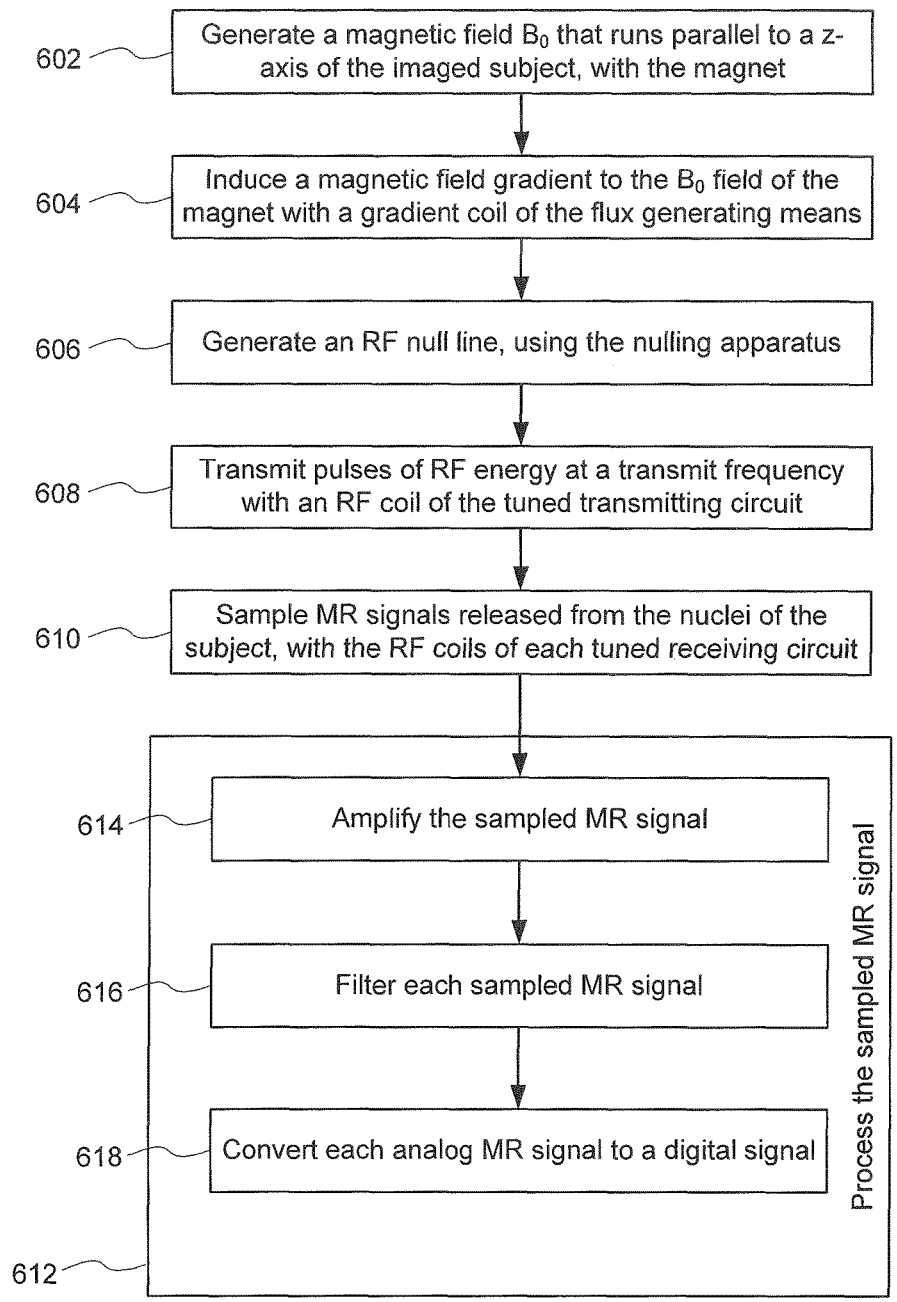
FIGS. 6 and 7 are flow diagrams of operations of the MRI magnet subsystem of FIG. 5.

FIG. 6 is a flow chart that depicts an operation 600 of the modified subsystem 500 of FIG. 5. As with operation 200 of FIG. 2, the steps of the operation 600 can be handled in a different order or simultaneously, and that steps may be added or omitted.

In blocks 602 and 604 of the operation 600, the magnet and flux generation means are activated. These blocks may be compared to blocks 202 and 204 of FIG. 2, which perform substantially similar activities. In block 606, the RF nulling apparatus is activated, thereby generating a null line along a line of the subject.

Blocks 608 and 610 may be substantially compared to blocks 206 and 208 in FIG. 2, except that blocks 608 and 610 involve the activation of multiple transmitter circuits and multiple receiver circuits, whereas blocks 206 and 208 involve activation of only one transmitter circuit and only one receiver circuit. In block 608, each of the tuned transmitter circuits 506 is activated. Because each transmitter circuit is tuned to a different center frequency, nuclei at a different imaging plane of the subject (or in this case, a different point along the null line) are excited by each respective transmitter circuit. In block 610, each of the tuned receiver circuits 508 is activated. Again, because each receiver circuit is tuned to a different center frequency, the MR signals generated from nuclei at a different slice of the subject are sampled by a different respective receiver circuit.

Lastly, in block 612 (including subblocks 614, 616 and 618), the sampled MR signals undergo processing. This processing is substantially comparable to the processing described in connection with the operation 200 of FIG. 2. In some examples of the second embodiment, each receiver circuit may be electrically coupled to a different processing circuit such that the MR signals sampled at each receiver at the same time may also be processed at the same time. This prevents the processing circuitry from holding up the overall speed of the operation 600 and permits the MR image to be generated relatively quickly (as compared to each receiver circuit sharing the same processing circuitry).

The operation 600 of FIG. 6 may be repeated along various null lines of the subject. For instance, as described above, a typical plane a scanned subject may be made up of 65,536 voxels in a 256 by 256 square grid. Thus, the operation 600 of FIG. 6 may be performed separately for each voxel, thereby acquiring MR signals from multiple imaging planes at the same time (in the example of the second embodiment, ten planes at a time).

Figure 7:
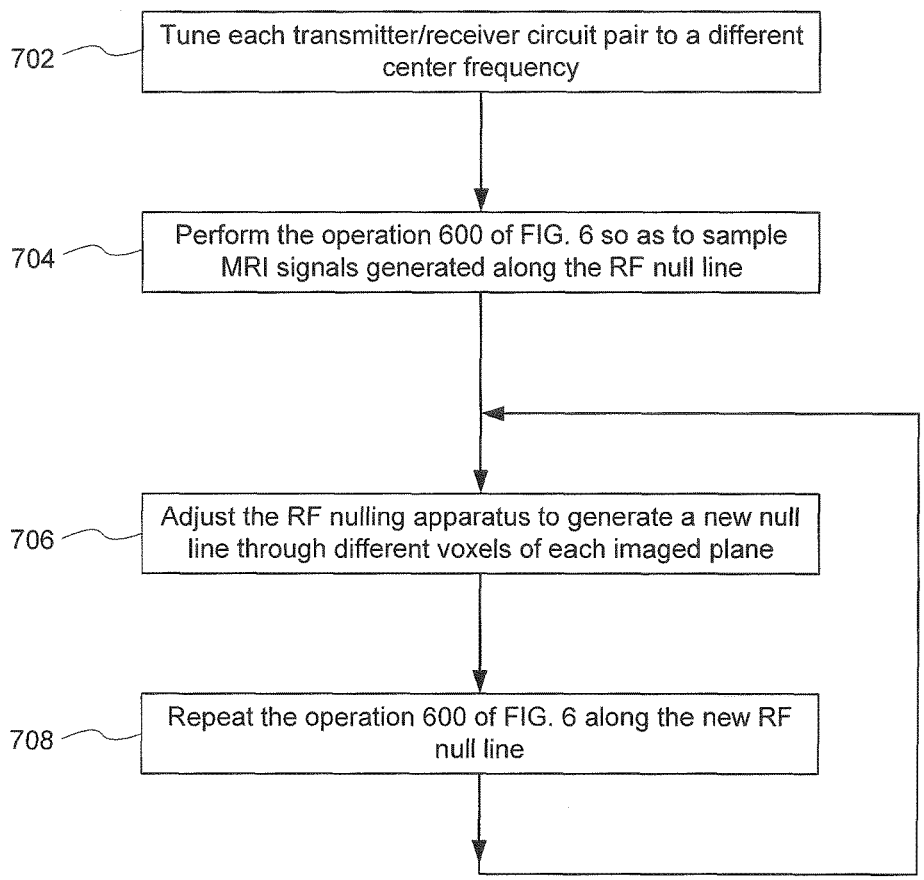

FIG. 7 is a flow diagram depicting an operation 600 of a multi-transmitter/receiver pair MRI subsystem, each transmitter and receiver having a relatively narrow bandwidth (e.g., about 1 Hz, about 10 Hz, about 100 Hz) for performing a multi-plane scan of a subject. In block 702, each transmitter circuit and receiver circuit pair is tuned to a different center frequency (e.g., 25.5 MHz, 25.5001 MHz, etc. for the transmitter and receiver circuits). The center frequencies may be spaced based on the bandwidth of each transmitter/receiver such that there is no overlap among the frequency bands of energy pulses generated by the transmitters, and such that there is no overlap among the frequency bands at which the receivers sample. For example, where each transmitter or receiver is tuned to a center frequency 10 Hz apart from one another, the bandwidth of each transmitter or receiver may be set to 10 Hz.

In block 704, the MRI system performs the operation 600 of FIG. 6 so as to sample MRI signals along the generated null line. Because of the narrow bandwidth of the energy pulse generated by each transmitter circuit, it can be directed so that only the nuclei along the null line are excited so as to generate MR signals during the scan. Each corresponding tuned receiver circuit, being set to a respective center frequency samples and processes the MR signals generated at each location along the null line.

In block 706, the RF nulling coils are adjusted so as to generate a new null line passing through different voxels of each imaged plane. In block 708, the excitation and sampling of operation 600 is repeated so as to sample MRI signals at the intersection of the new null line with each imaging slice of the subject (corresponding to the selected center frequencies). The steps of blocks 706 and 708 may be repeated as many times as necessary (e.g., 256 times, 65,536 times) in order to complete the scan of each plane, with each iteration of the operation 600 being performed at a different null line so as to generate and sample MRI signals of different points within the imaged planes of the subject.

In some examples of the disclosure, reiteration of blocks 706 and 708 may involve using different RF nulling coils of the RF nulling apparatus in order to generate the desired null line.

Also, in some examples, the multiple narrow-bandwidth transmitter circuits 506 of the modified MRI subsystem 500 may be replaced with a single high-bandwidth transmitter circuit. As discussed above in connection with the first embodiment, while the above example operations utilize a low-bandwidth transmitter circuit to achieve excitation of a relatively thin slice of nuclei within the subject, the low-bandwidth transmitter circuit is not necessary to achieve low-bandwidth sampling of the subject. For instance, a high-bandwidth transmitter circuit may be used to excite a relatively thick slice of nuclei within the subject. The center frequencies of the low-bandwidth transmitters may then be centered at frequencies within the band of frequencies corresponding to the nuclei (or planes of nuclei) excited by the generated RF energy pulse of the high-bandwidth transmitter.

In the second embodiment, the total bandwidth along the length of the RF null line would be relatively large (e.g., 500 kHz), as compared to the bandwidth of each tuned receiver circuit. Still, even assuming that all of the receiver circuits 508 covered the entire bandwidth (e.g., each of the ten receiver circuits covering a 50 kHz bandwidth of the total 500 kHz bandwidth) the SNR of the image generated from the excited and sampled line would be increased by a factor of sqrt(500,000/50,000) or 3.16. At the same time, because 10 voxels along the RF null line would be imaged all at the same time, the total amount of time necessary to perform a scan of the subject (e.g., a 10-plane scan, a 15-plane scan, etc.) would be ten times less. Moreover, this could be accomplished without phase encoding the MR signals sampled by the receiver circuits. Still, total imaging time would take about 980 seconds (or approximately 16 minutes). Additionally, total imaging time for any single imaging plane would not be reduced, as the reduction of time in the second embodiment comes from sampling and processing multiple imaging planes at once.

Figure 8:
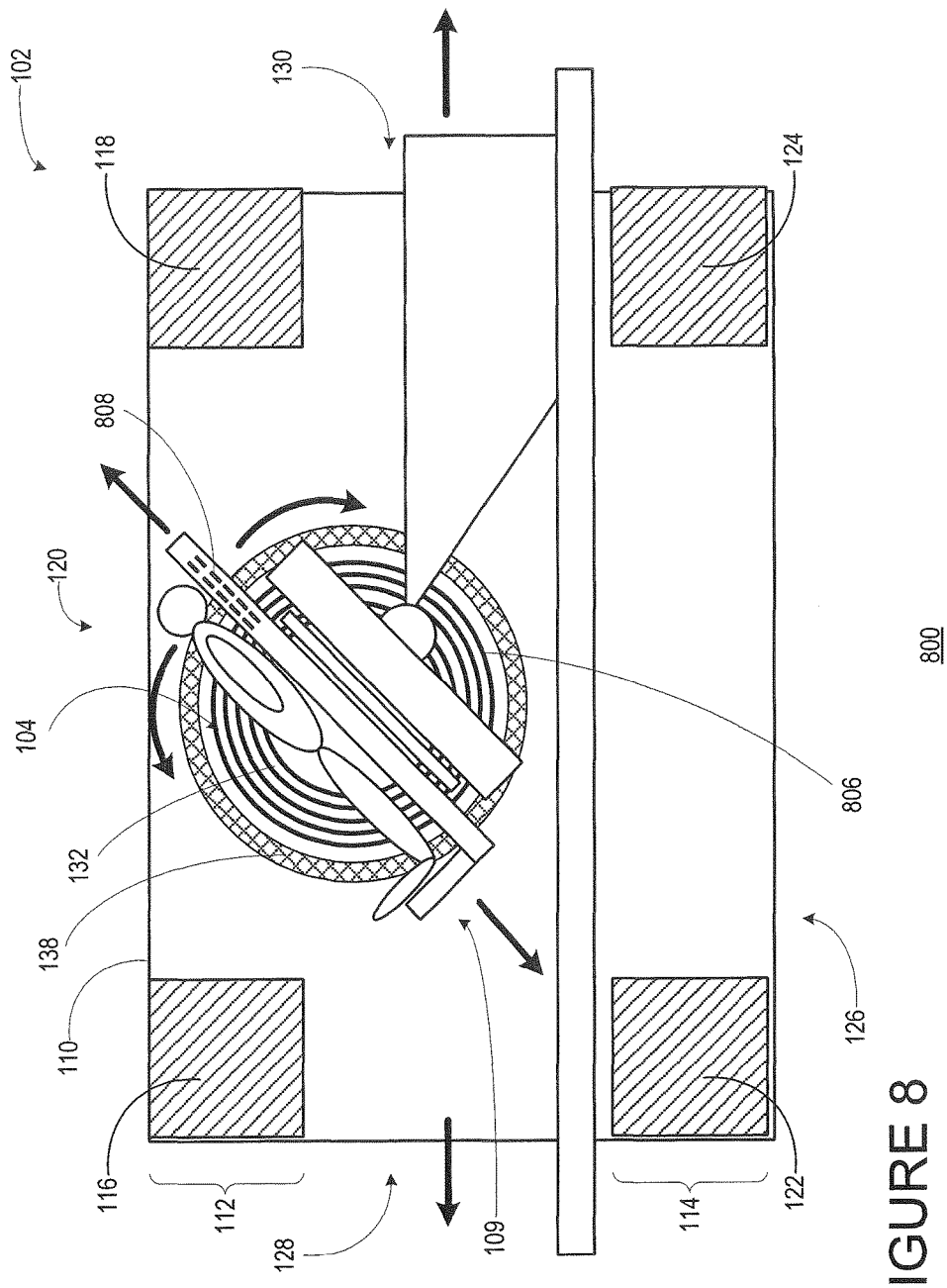
FIG. 8 is a sectional view of yet another MRI magnet subsystem according to yet another aspect of the disclosure.

One way to reduce the amount of time necessary to generate an MR image of even a single imaging plane while maintaining increased SNR of the MR signals is to provide multiple pairs of transmitter and receiver circuits to operate simultaneously on the same imaging plane. Providing multiple transmitter and receiver circuits that operate simultaneously enables relatively fast acquisition of multiple voxels within the same imaging plane. Each transmitter/receiver circuit pair could be configured to excite, sample and process separate voxels of the same plane at the same time. FIG. 8 is another modified MRI subsystem 800 according to a third embodiment of the disclosure having simultaneously operative pairs of transmitter and receiver circuits set at the same frequency. The modified MRI subsystem 800 includes all the same components as the MRI subsystem 100 of the first embodiment, and further includes multiple tuned transmitter circuits 806 and multiple tuned receiver circuits 808. Each receiver circuit may be focused to sample a respective voxel of the imaging plane using, for example, a combination of phase-encoding and frequency-encoding techniques. In other examples, two-dimensional frequency-encoding techniques may be used.

As discussed in connection with each of the first two embodiments, the multiple transmitter circuits 806 of the subsystem 800 may be replaced with a single transmitter circuit.

FIG. 9 is a flow chart that depicts an operation 900 of a subsystem comparable to the subsystem 800 of FIG. 8 but having a single tuned transmitter circuit. As with the other above described operations, the following steps of the operation 900 do not have to be performed in the precise order described below. Rather, various steps can be handled in a different order, or simultaneously. Moreover, steps may be added or omitted.

In blocks 902, 904, 906, 910 (including subblocks 912-916) and 920 of the operation 900, the magnet, flux generation means, and tuned transmitter circuit are activated. These blocks may be compared to blocks 202, 204, 206, 210 (including subblocks 212-216) and 220 of FIG. 2, respectively, which perform substantially similar activities.

Block 908 may be substantially compared to block 208 in FIG. 2, except that in block 908, multiple receiver circuits are activated, whereas in block 208 only one receiver circuit is activated. In block 908, all of the tuned receiver circuits 808 are configured to receive MR signals from different voxels of the imaging plane (e.g., using a combination of frequency-encoding and phase-encoding). Each respective receiver circuit then samples the MR signals generated from the nuclei at that particular voxel(s) of the imaging slice.

The operation 900 of FIG. 9 may be repeated until every voxel of every row of the imaging plane has been sampled. Additionally, the operation 900 of FIG. 9 may be repeated for multiple planes (e.g., one plane at a time), thereby acquiring and generating MR images of multiple planes of the subject and significantly increasing the speed of MR imaging.

Another way to reduce the amount of time necessary to generate an MR image of even a single imaging plane is to streamline the downstream processing of the phase-encoded and frequency-encoded imaging plane. FIG. 10 is a schematic diagram of a receiver subsystem depicting various components that may be coupled to the receiver circuitry discussed above with regard to the modified MRI subsystem of FIG. 8. Here, by way of example only, the multiple receiver circuits may be coupled to multiple downstream processing components, e.g., phase detectors 1020, 1030, and 1040, filters, amplifiers, and digitizers. Even though only three phase detectors are depicted in FIG. 10, the number of phase detectors that may be utilized in the receiver subsystem of the modified MRI subsystem of FIG. 8 is not limited thereto. Thus, the number of phase detectors used may depend on various factors of the MR imaging process, e.g., size of imaging plane, number of cells/voxels in the imaging plane, variation of magnetic field strength of phase-encoding gradient.

During phase-encoding, a magnetic field gradient is applied along its gradient axis, e.g., y-axis, such that its magnetic field strength gradually varies along the direction of its axis. Because of at least this variation in magnetic field strength, the phase-encoding gradient axis of the imaging plane may be divided into multiple frequency domains. For instance, rows may form along the y-axis of the imaging plane, as will be discussed in greater detail with regard to FIG. 11 below. Similar to the concept of narrow-bandwidth imaging described above, each of the phase detectors may be simultaneously configured to detect only the frequencies associated with a particular phase shift (e.g., certain rows/columns of the imaging plane) and narrowly band pass those frequencies to perform Fourier Transform analysis required to generate an MRI image. This approach may significantly increase the speed and overall performance of MR imaging.

In FIG. 10, when the phase-encoding and frequency-encoding gradients have been applied to the imaged object, receiver circuitry 1010 may detect and receive the emitted MR signals from the imaging plane. Receiver circuitry 1010 may comprise one or more receiver coils, e.g., 256 receiver coils, necessary to acquire a full image data set to be processed by the phase detectors, filters, amplifiers, digitizers, and computing devices downstream. Once the RF signals are received, the receiver circuitry 1010 relays those signals to phase detectors, 1020, 1030 and 1040. These phase detectors are coupled to phase shifter 1050, which helps separate the signals received by the phase detectors 1030 and 1040 for signal detection. As alluded to above, phase detectors 1020, 1030 and 1040 may be tuned to detect various frequencies associated with a particular phase shift. The association may be made by simply tuning phase detector 1020 to detect that particular phase shift, for instance. When the phase detectors simultaneously detect the frequencies associated with their respectively assigned phase shifts, then each phase detector may accept the signal and subsequently send it through a filter, an amplifier and a digitizer in order to generate an MRI image of the object with the aid of computing device 300. The filters, amplifiers, and digitizers are depicted as separate components in FIG. 10. Alternatively, however, the depicted filters, amplifiers, and digitizers may also reside within computing device 300.

FIG. 11 is a diagram of a two-dimensional imaging plane examined and processed by the receiver subsystem of FIG. 10. As shown, the imagining plane 1100 comprises 25 different cells. Although these cells are two-dimensional representations of the imaged object, they represent the voxel(s) of a slice of the imaged subject. The phase-encoding gradient is applied along the y-axis, which divides the y-axis into five separate frequency domain rows: $\omega_1$, $\omega_2$, $\omega_3$, $\omega_1$, and $\omega_n$ (where n represents the last sequential row of the imaging plane).

Similarly, the frequency-encoding gradient is applied along the x-axis and divides the x-axis into five separate columns: $f_1$, $f_2$, $f_3$, $f_{n-1}$, and $f_n$ (where n represents the last sequential column of the imaging plane). Signals emitted from each cell of FIG. 11 may be represented by the equation $f_a + \omega_b \Delta t$, where "a" represents the column number and "b" represents the row number. For example, the signal emitted from the voxel associated with column f1 and row $\omega 1$ is $f_1 \omega_1 \Delta t$. Thus, signal $f_1 + \omega_1 \omega t$ emits frequency $f_1$ and phase shift $\omega_1 \Delta t$. In that regard, the composite signal generated at row $\omega_1$ may be represented by: $\Delta \Phi_1 = (f_1 + \omega_1 \Delta t) + (f_2 + \omega_1 \Delta t) + (f_3 + \omega_1 \Delta t) + (f_{n-1} + \omega_1 \Delta t) + (f_n + \omega_1 \Delta t)$. As depicted in FIG. 11, this composite signal is represented by signal chain 1. Likewise, composite signal chains 2, 3, n−1, and n may be represented in a similar manner.

Each of the phase detectors 1020, 1030, and 1040 in FIG. 10 and additional phase detectors (not shown) may be configured to simultaneously detect specific phase shifts of the composite signal chains 1, 2, 3, n−1, and n depicted in FIG. 11. In other words, the phase shifts in the composite signal chains that do not correspond to a specific phase shift of a phase detector will be blocked out by that phase detector. By way of example only, phase detector 1020 may be tuned to detect only frequencies containing phase shift $\omega_1 \Delta t$ (e.g., row with composite signal 1). Thus, it will block out any composite signal chains that do not contain phase shift $\omega_1 \Delta t$. Accordingly, a full data set of the imaging plane described above may be collected in a single signal acquisition to generate an MRI image, as opposed to the time consuming process of repetitively turning on and off the phase-encoding and frequency-encoding gradients to acquire signals from each voxel in traditional MRI methods. In this regard, the speed, efficiency, and/or overall performance of MR imaging is significantly increased.

Moreover, to illustrate the maintained increase in SNR in the third embodiment, consider an MRI apparatus having a plurality of RF receiver circuits that operate with a bandwidth of 500 kHz. The increase of SNR in the apparatus of the present embodiment would be equal to the square root of the reduction in bandwidth. For instance, if an MRI subsystem having 256 receiver circuits were to operate at a bandwidth of 1 Hz instead of 500 kHz, it would have an increase in SNR of sqrt(500,000/1) or about 700 times. For further example, a subsystem having 26 (or about 25.6) receiver circuits each operating at a bandwidth of 10 Hz instead of 500 kHz would have an increase in SNR of sqrt(500,000/10) or about 220 times. Even a subsystem having only 3 (or about 2.56) receiver circuits at a bandwidth of 100 Hz would have a significant increase in SNR of sqrt(500,000/100) or about 70 times. This demonstrates the significant improvement in SNR yielded by the low-bandwidth MR sampling of the third embodiment.

Additionally, if the tuned receiver circuits 708 have a sampling time of 10 ms, 256 MR signals can be received and processed by the receiver circuits (e.g., by 256-1 Hz receivers, by 26-10 Hz receivers, by 3-100 Hz receivers, etc.) in the span of 10 milliseconds. Accordingly, an entire imaging plane may be acquired in only about 2.56 seconds, meaning that a full 15-plane scan of the subject would take no more than about 38.4 seconds (about 0.6 minutes). This represents a significant reduction in the imaging time for a full low-bandwidth MRI scan.

The imaging time may be even further reduced in light of the fact that the MR signals are being individually acquired, thus none of the Fourier frequencies are needed. As such, even 1 millisecond of sampling and processing may be sufficient to acquire each voxel of the imaging plane. Such sampling would further reduce the necessary time for imaging an entire plane by ten times. In the above example, for instance, only about 0.256 seconds would be needed per imaging plane, or about 3.84 seconds for a full 15-plane scan.

Those skilled in the art will recognize that the minimum sampling time of each tuned receiver circuit is limited by the Nyquist condition to be at least double the frequency at which the receiver circuit operates. This is easily achievable in the present disclosure by simply raising the sampling frequency on any signal to a sampling time more than twice the highest MR frequency.

Although the invention of the present disclosure is largely described as including either (a) the same number of transmitter circuits and receiver circuits or (b) only one transmitter circuit and multiple receiver circuits, it will be understood that other embodiments of the disclosure could certainly include multiple transmitter circuits and multiple receiver circuits without requiring the number of each circuit to be the same. The operation of such a system would effectively be no different than the operation of a system with only one transmitter circuit and multiple receiver circuits, except potentially to divide the bandwidth of the one transmitter circuit between multiple such circuits. In a similar vein, there is no requirement that the transmitter circuits and receiver circuits necessarily have the same bandwidth as one another, so long as the receiver circuits are configured to detect MR signals that are generated by the (e.g., the receiver circuit having a center frequency within the operating frequency band of one or more transmitter circuits).

1. Although the invention herein has been described with reference to particular embodiments, it is to be understood that these embodiments are merely illustrative of the principles and applications of the present invention. It is to be understood that numerous modifications may be made to the illustrative embodiments and that other arrangements may be devised without departing from the spirit and scope of the present invention as defined by the appended claims.

The invention claimed is:

1. A system for magnetic resonance (MR) imaging comprising:
   one or more computing devices;
   one or more gradient coils;
   a receiver subsystem coupled to the one or more computing devices; and
   a memory storing a plurality of data, and instructions executable by the one or more computing devices,
   wherein the instructions cause the one or more gradient coils to:
      activate a first magnetic field gradient;
      apply the first magnetic field gradient along a first direction, such that the first magnetic field gradient divides the first direction into a plurality of frequency domains;
      activate a second magnetic field gradient; and
      apply the second magnetic field gradient along a second direction perpendicular to the first direction;
   wherein the instructions cause the receiver sub-system to:
      receive a plurality of signals for each of the frequency domains at a set of phase detectors, each phase detector tuned to detect and pass frequencies associated with a particular phase shift; and
      perform analysis on the signals to generate an MR image.

2. The system of claim 1, wherein the first magnetic field gradient is a phase-encoding gradient and the second magnetic field gradient is a frequency-encoding gradient.

3. The system of claim 2, wherein the phase-encoding gradient is pulsed for a first duration of time and the frequency-encoding gradient is turned on for a second duration of time, such that the time of the second duration of time is different than the first duration of time.

4. The system of claim 2, wherein the phase-encoding gradient is pulsed for a first duration of time and the frequency-encoding gradient is turned on for a second duration of time, such that the time of the second duration of time is substantially equal to the first duration of time.

5. The system of claim 1, wherein the analysis includes Fourier Transform.

6. The system of claim 1, wherein the frequencies detected and passed by the phase detector are band passed via a narrow band pass filter.

7. The system of claim 1, wherein each of the plurality of frequency domains is represented by $\Delta\Phi_n=\omega_n\Delta t$, n being an integer which corresponds to a sequential position.

8. The system of claim 1, wherein the set of phase detectors has a plurality of phase detectors to accommodate each phase shift corresponding to the frequency domains.

9. The system of claim 1, wherein each phase detector blocks out frequencies not associated with the particular phase shift assigned thereto.

10. A system for magnetic resonance (MR) imaging comprising:
    one or more computing devices;
    one or more gradient coils;
    a receiver subsystem coupled to the one or more computing devices; and
    a memory storing a plurality of data, and instructions executable by the one or more computing devices,
    wherein the instructions cause the one or more gradient coils to:
       activate a first magnetic field gradient;
       apply the first magnetic field gradient along a first direction, such that the first magnetic field gradient divides the first direction into a plurality of frequency domains;
       activate a second magnetic field gradient; and apply the second magnetic field gradient along a second direction perpendicular to the first direction;
    wherein the instructions cause the receiver sub-system to:
       receive a plurality of signals for each of the frequency domains;
       filter the signals based upon a particular phase shift; and
       perform analysis on the signals to generate an MR image.

11. A computer-implemented method of magnetic resonance (MR) imaging, comprising:
    activating, using one or more gradient coils, a first magnetic field gradient;
    applying the first magnetic field gradient along a first direction, such that the first magnetic field gradient divides the first direction into a plurality of frequency domains;
    activating, using the one or more gradient coils, a second magnetic field gradient;
    applying the second magnetic field gradient along a second direction perpendicular to the first direction;
    receiving a plurality of signals for each of the frequency domains at a set of phase detectors, each phase detector tuned to detect and pass frequencies associated with a particular phase shift; and
    performing, using one or more processors, analysis on the signals to generate an MR image.

12. The method of claim 11, wherein the first magnetic field gradient is a phase-encoding gradient and the second magnetic field gradient is a frequency-encoding gradient.

13. The method of claim 12, wherein the phase-encoding gradient is pulsed for a first duration of time and the frequency-encoding gradient is turned on for a second duration of time, such that the time of the second duration of time is different than the first duration of time.

14. The method of claim 12, wherein the phase-encoding gradient is pulsed for a first duration of time and the frequency-encoding gradient is turned on for a second duration of time, such that the time of the second duration of time is substantially equal to the first duration of time.

15. The method of claim 11, wherein the analysis includes Fourier Transform.

16. The method of claim 11, wherein the frequencies detected and passed by the phase detector are band passed via a narrow band pass filter.

17. The method of claim 11, wherein each of the plurality of frequency domains is represented by $\Delta\Phi_n=\omega_n\Delta t$, n being an integer which corresponds to a sequential position.

18. The method of claim 11, wherein the set of phase detectors has a plurality of phase detectors to accommodate each phase shift corresponding to the frequency domains.

19. The method of claim 11, wherein each phase detector blocks out frequencies not associated with the particular phase shift assigned thereto.

* * * * *